(12) United States Patent
Fujii et al.

(10) Patent No.: US 7,947,926 B2
(45) Date of Patent: May 24, 2011

(54) HEAT TREATMENT APPARATUS, HEAT TREATMENT METHOD, AND RECORDING MEDIUM RECORDING PROGRAM FOR PRACTICING THE METHOD

(75) Inventors: Katsuhisa Fujii, Koshi (JP); Tetsuya Oda, Koshi (JP); Akihiro Kubo, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1062 days.

(21) Appl. No.: 11/740,497

(22) Filed: Apr. 26, 2007

(65) Prior Publication Data

US 2007/0286709 A1 Dec. 13, 2007

(30) Foreign Application Priority Data

May 10, 2006 (JP) .................................. 2006-131379

(51) Int. Cl.
*H01L 21/02* (2006.01)
*F27B 5/10* (2006.01)

(52) U.S. Cl. ......... 219/390; 118/725; 118/728; 118/733
(58) Field of Classification Search .................... None
See application file for complete search history.

(56) References Cited

U.S. PATENT DOCUMENTS

2002/0056417 A1* 5/2002 Yonemizu et al. ............ 118/724

FOREIGN PATENT DOCUMENTS

| JP | 2000-183069 | 6/2000 |
| JP | 2001-274064 | 10/2001 |

OTHER PUBLICATIONS

Machine translation of JP2000-183069A.*

* cited by examiner

*Primary Examiner* — Joseph M Pelham
(74) *Attorney, Agent, or Firm* — Oblon, Spivak, McClelland, Maier & Neustadt, L.L.P.

(57) ABSTRACT

In a heat treatment method in which a semiconductor wafer is carried into a heat treatment chamber constituted of a heat plate and a cover body covering the heat plate and processed, until the wafer is carried into the heat treatment chamber, an opening and closing operation of the cover body is performed to maintain the accumulated heat temperature of the heat treatment chamber at a prescribed processing temperature.

24 Claims, 11 Drawing Sheets

COVER BODY REAR SURFACE TEMPERATURE (°C)

HEAT TREATMENT APPARATUS, HEAT TREATMENT METHOD, AND RECORDING MEDIUM RECORDING PROGRAM FOR PRACTICING THE METHOD

BACKGROUND OF THE INVENTION

1. Field of the Invention

The present invention relates to apparatus and method of performing heat treatment on a workpiece substrate, e.g., a semiconductor wafer, an LCD glass substrate or the like that has been coated and developed, and to a recording medium recording a program for practicing the method.

2. Description of the Background Art

Generally, in manufacturing a semiconductor device, the photolithography technique is used for forming a thin film of ITO (Indium Tin Oxide) or an electrode pattern on a semiconductor wafer, an LCD glass substrate or the like (hereinafter referred to as a wafer or the like). In the photolithography technique, photoresist is coated on a wafer or the like to form a resist film. The formed resist film is exposed in accordance with a prescribed circuit pattern. By developing the exposed pattern, the circuit pattern is formed on the resist film.

In such a photolithography process, various types of baking processing are performed, such as baking processing after resist coating (pre-bake), baking processing after exposure (post-exposure bake), and baking processing after developing processing (post-bake).

One known conventional heat treatment apparatus performing such processing is configured for forming a heat processing atmosphere by a heat plate having a heater embedded and a cover body covering the heat plate. The heat treatment apparatus performs heat treatment on the wafers or the like placed on the heat plate by setting the processing atmosphere to a processing temperature by the radiant heat from the heat plate. Here, unlike the heat plate, the cover body forming the processing atmosphere does not have its temperature controlled. Therefore, even during the heat treatment, the temperature of the cover body remains lower than the set temperature of the heat plate, affecting the processing temperature and resulting in unstable heat treatment. Accordingly, there is a known conventional heat treatment apparatus having a structure in which a heat pipe is embedded in the cover body so as to improve the heat transfer performance of the cover body (e.g., see Japanese Patent Laying-Open No. 2000-183069).

Meanwhile, generally in the photolithography process, wafers or the like on a lot-by-lot basis are continuously carried to (carried into) processing portions including a heat treatment apparatus and processed. The processed wafers or the like are carried away from the processing portion, and thereafter wafers or the like of the subsequent lot are similarly processed. Accordingly, the heat treatment apparatus is in a standby mode in a period after processing of the wafers or the like of the preceding lot is finished and until processing of the wafers or the like of the subsequent lot is started. The temperature of the treatment chamber in this period varies depending on whether the cover body is open or closed. When the cover body is closed as the normal state, the temperature in the treatment chamber is higher than the processing temperature. Conversely, when the cover body is open, the temperature in the treatment chamber is lower than the processing temperature. Accordingly, there has been a problem that the processing temperature for the wafers or the like of the subsequent lot carried into the heat treatment apparatus becomes unstable, resulting in an uneven processing accuracy such as an uneven line width in the baking processing after exposure, and a reduction in yield.

A possible solution to such a problem may be to adjust the heating temperature of the heat plate to maintain the processing temperature. However, as described above, since the temperature of the treatment chamber is affected by the temperature of the cover body and becomes lower than the temperature of the heat plate, it is difficult to maintain the processing temperature by adjusting the heating temperature of the heat plate. As to the apparatus disclosed in Japanese Patent Laying-Open No. 2000-183069, while it shows excellent responsiveness to the change in the temperature of the treatment chamber associated with increase or decrease in the temperature of the heat plate owing to the enhanced heat transfer performance, it is still difficult to maintain the processing temperature by adjusting the heating temperature of the heat plate and cover body. Moreover, the apparatus disclosed in Japanese Patent Laying-Open No. 2000-183069 additionally suffers from a complicated structure and an increased size.

SUMMARY OF THE INVENTION

An object of the present invention is to provide a heat treatment apparatus, a heat treatment method, and a recording medium recording a program for practicing the method, which can even the processing accuracy and improve the product yield by maintaining the temperature of a heat treatment chamber at a prescribed processing temperature before workpiece substrates are processed, without the necessity of providing a separate temperature controlling apparatus or the like.

The present invention provides a heat treatment method of performing heat treatment on a workpiece substrate using a heat treatment apparatus that has a heat plate provided in a heat treatment chamber and that is capable of opening and closing the heat treatment chamber by an opening and closing operation of a cover body, including the steps of: maintaining a temperature in the heat treatment chamber at a prescribed temperature by performing the opening and closing operation of the cover body; carrying the workpiece substrate into the heat treatment chamber; and performing heat treatment with the heat plate on the workpiece substrate carried into the heat treatment chamber.

Preferably, in the heat treatment method, the opening and closing operation of the cover body includes opening and closing the cover body for a plurality of times.

Preferably, in the heat treatment method, the prescribed temperature is set based on a processing temperature of the heat treatment.

Preferably, in the heat treatment method, at least one of an opening time and a closing time of the cover body in the opening and closing operation of the cover body is set based on a curve indicative of a relationship between a ratio between the opening time and the closing time of the cover body and a temperature in the heat treatment chamber, and on a processing temperature of the heat treatment.

With such a configuration, the optimum opening time and/or closing time can be set so that the temperature in the heat treatment chamber approximates the treatment temperature.

Preferably, in the heat treatment method, at least one of an opening time and a closing time of the cover body in the opening and closing operation of the cover body is set based on a curve indicative of a relationship between a ratio between the opening time and the closing time of the cover body and a temperature in the heat treatment chamber, on a processing temperature of the heat treatment, and on a state of a carrying portion carrying the workpiece substrate to the heat treatment chamber.

With such a configuration, the optimum opening time and/or closing time can be set so that the temperature in the heat treatment chamber approximates the treatment temperature. Thus, even when performing heat treatment on workpiece substrates of different lots continuously, the temperature in the heat treatment chamber can approximate the optimum processing temperature. That is, after the last workpiece substrate in the preceding lot passes through the heat treatment chamber and until the first workpiece substrate of the subsequent lot is carried into the heat treatment chamber, the timing of carrying the workpiece substrate of the subsequent lot may vary. In such a case, the opening time and/or closing time in the opening and closing operation of the cover body can be set corresponding to the carrying state of the carrying portion.

Preferably, the heat treatment method further includes a step of sensing a temperature of the heat plate. The opening and closing operation of the cover body is controlled based on the sensed temperature of the heat plate.

With such a configuration, the temperature in the heat treatment chamber can be maintained at the processing temperature corresponding to the current temperature of the heat plate.

Preferably, the heat treatment method further includes a step of sensing a temperature of heat treatment chamber. The opening and closing operation of the cover body is controlled based on the sensed temperature of the heat treatment chamber.

With such a configuration, the temperature in the heat treatment chamber can be maintained at the processing temperature corresponding to the current temperature of the heat treatment chamber.

Preferably, in the heat treatment method, the heat treatment is performed on a plurality of the workpiece substrates. When a processing temperature of the plurality of the workpiece substrates is changed, a standby time until the opening and closing operation of the cover body is started is set based on a change width in the temperature.

With such a configuration, superfluous opening and closing operations of the cover body can be eliminated.

The present invention provides a recording medium recording a program operating on a computer. The recorded program is configured to cause the computer to control the opening and closing operation of the cover body so that the aforementioned heat treatment method is performed.

The present invention provides a heat treatment apparatus performing heat treatment on a workpiece substrate, including: a heat plate heating the workpiece substrate; a case that has an upper opening and that surrounds a circumference and a lower portion of the heat plate; a cover body that covers the upper opening and constituting, with the case, a heat treatment chamber storing the heat plate and the workpiece substrate; an opening/closing driving portion that opens and closes the cover body relative to the case; and a control portion that controls the opening and closing operation of the cover body by the opening/closing driving portion. The control portion controls the opening/closing driving portion such that a temperature in the heat treatment chamber is maintained at a prescribed temperature by the opening and closing operation of the cover body.

Preferably, in the heat treatment apparatus, the control portion controls the opening/closing driving portion to open/close the cover body for a plurality of times.

Preferably, in the heat treatment apparatus, the control portion sets the prescribed temperature based on a processing temperature of the heat treatment.

Preferably, in the heat treatment apparatus, the control portion sets at least one of an opening time and a closing time of the cover body in the opening and closing operation of the cover body based on a curve indicative of a relationship between a ratio between the opening time and the closing time of the cover body and a temperature in the heat treatment chamber, and on a processing temperature of the heat treatment.

Preferably, in the heat treatment apparatus, the control unit sets at least one of an opening time and a closing time of the cover body in the opening and closing operation of the cover body based on a curve indicative of a relationship between a ratio between the opening time and the closing time of the cover body and a temperature inside the heat treatment chamber, on a processing temperature of the heat treatment, and on a state of a carrying portion carrying the workpiece substrate to the heat treatment chamber.

Preferably, the heat treatment apparatus further includes a temperature sensing portion sensing a temperature of the heat plate. The control portion controls the opening/closing driving portion based on the temperature of the heat plate sensed by the temperature sensing portion.

According to the present invention, maintaining the accumulated heat temperature of the heat treatment chamber at the processing temperature by performing opening and closing operation of the cover body, the temperature of the heat treatment chamber can be maintained at the processing temperature before workpiece substrates are processed, without the necessity of providing a separate temperature controlling apparatus or the like. Thus, workpiece substrates carried into the heat treatment chamber can be processed under a constant processing temperature on arrival. Accordingly, the processing accuracy can be evened and the product yield can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the best embodiment of the present invention will be detailed referring to the accompanying drawings. The description is given as to the case where the heat treatment apparatus according to the present invention is applied to a heat treatment apparatus in a resist coating/developing processing system for semiconductor wafers.

Figure 1:
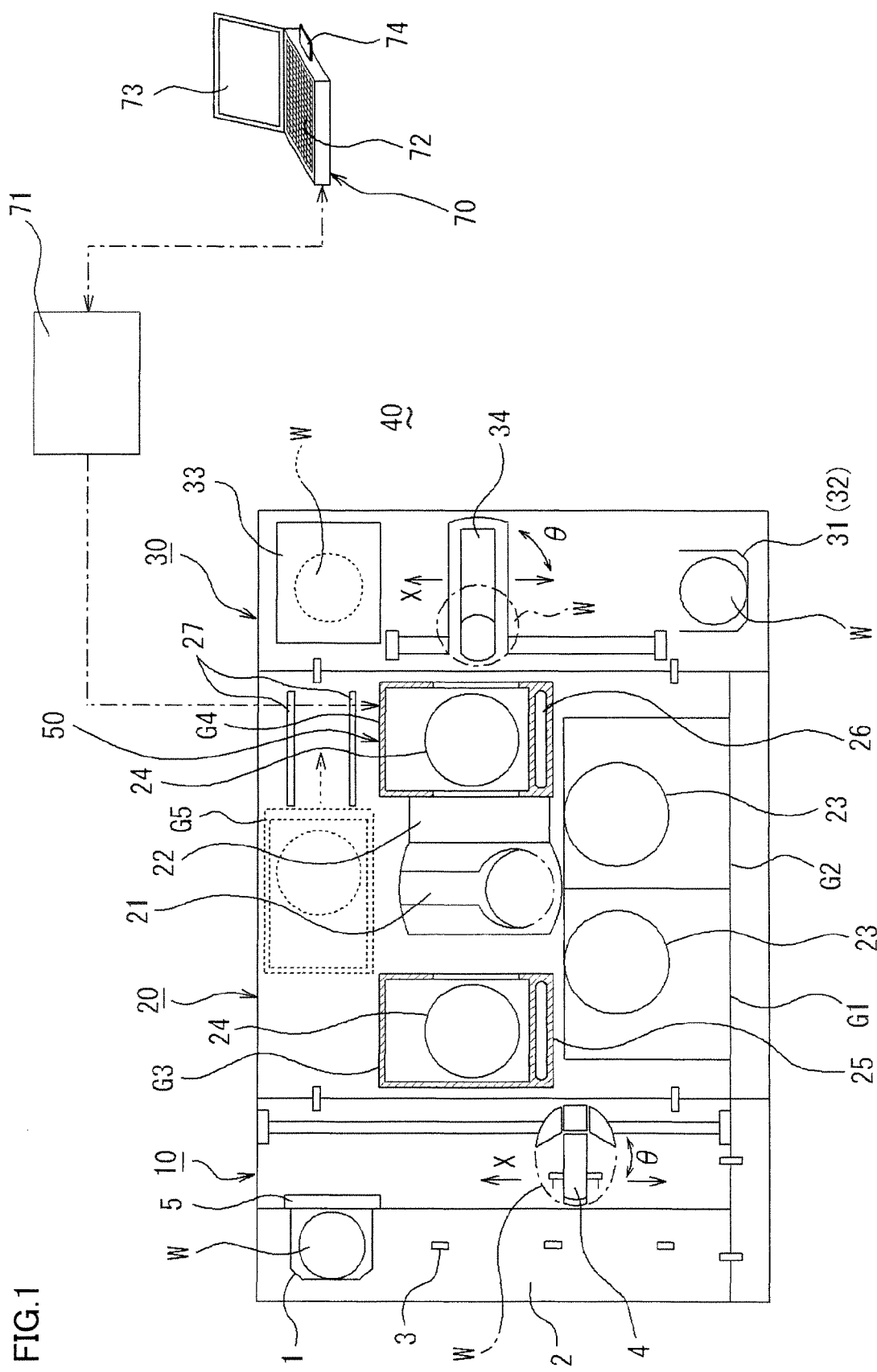
FIG. 1 is a schematic plan view of an exemplary resist coating/developing processing system to which a heat treatment apparatus according to the present invention is applied.
Figure 2:
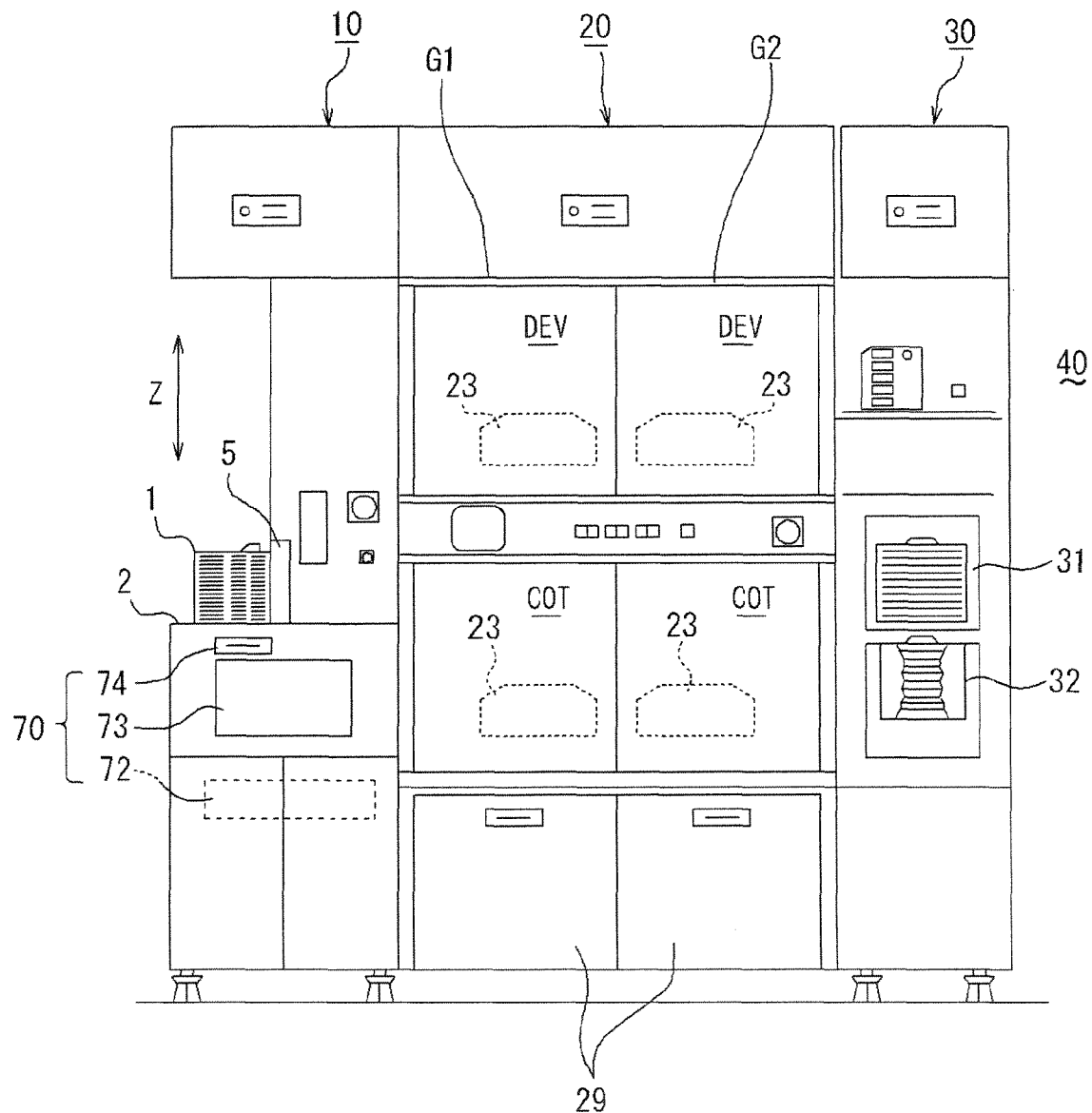
FIG. 2 is a schematic front elevation view of the resist coating/developing processing system.
Figure 3:
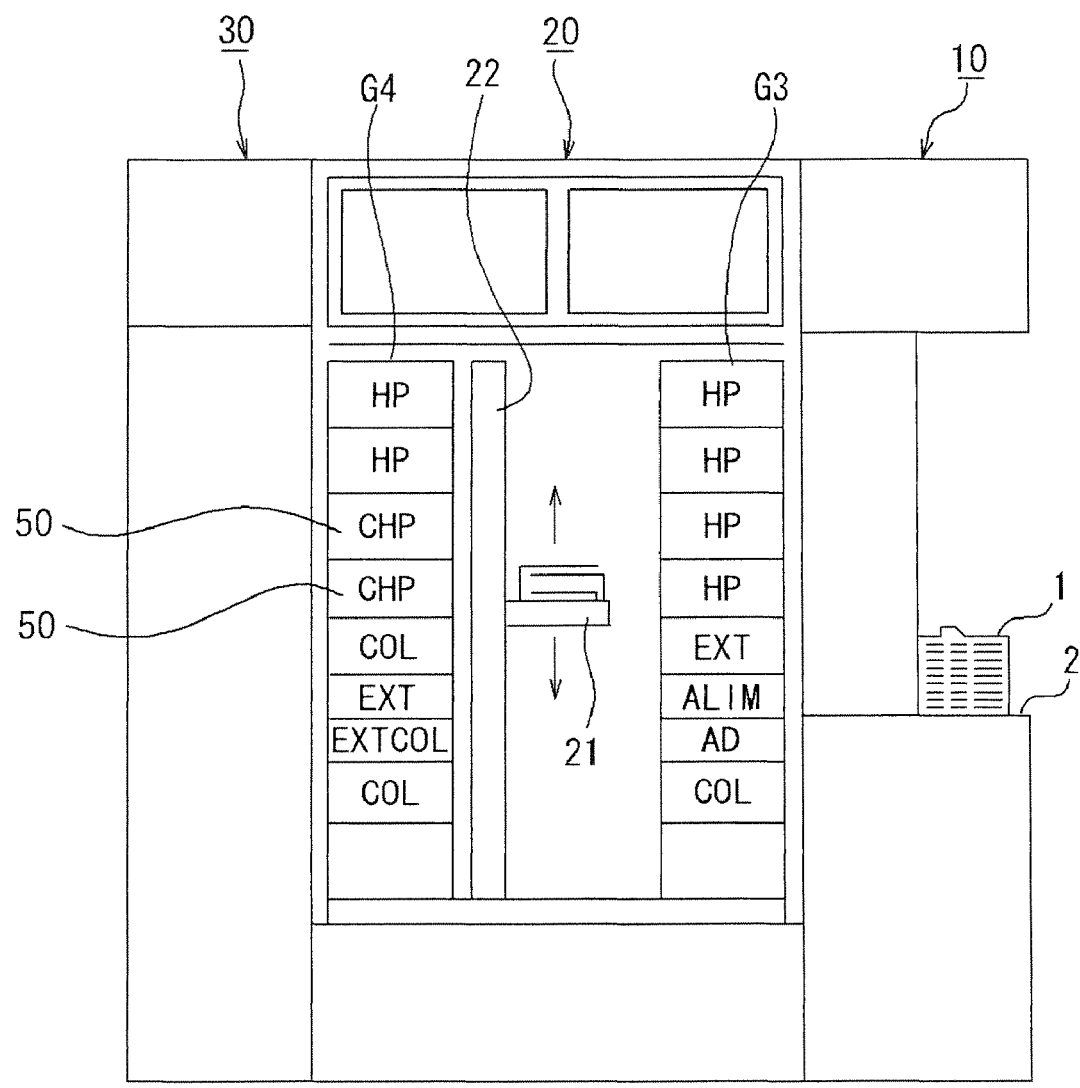
FIG. 3 is a schematic rear elevation view of the resist coating/developing processing system.

FIG. 1 is a schematic plan view of one embodiment of the resist coating/developing processing system. FIG. 2 is a front elevation view thereof. FIG. 3 is a rear elevation view thereof.

The substantial portion of the resist coating/developing processing system is constituted of a cassette station 10 (carrying portion), a processing station 20, and an interface portion 30. Cassette station 10 is for externally carrying into the system, or away from the system, a plurality, e.g., 25 pieces per unit, of semiconductor wafers W that are workpiece substrates (hereinafter referred to as wafers W) as stored in a wafer cassette 1, and for carrying wafers W away from or into wafer cassette 1. Processing station 20 includes a processing apparatus constituted of various sheet-feed processing units arranged to form multiple stages at prescribed positions for performing prescribed processing on wafers W one by one in the coating/developing process. Interface portion 30 is for transferring wafers W between processing station 20 and an adjacent exposure apparatus (not shown).

As shown in FIG. 1, cassette station 10 is configured as follows. A plurality of (e.g., up to four) wafer cassettes 1 with a cover are each placed at the position of a protrusion 3 on a cassette placing table 2 in a line along the horizontal X direction, having respective wafer slots oriented toward processing station 20. A cover opening/closing apparatus 5 is arranged opposing to each wafer cassette 1. A wafer carrying pin set 4, which is movable in the cassette arrangement direction (X direction) and in the wafer arrangement direction (Z direction) of wafers W stored along the vertical direction in wafer cassette 1, selectively carries wafers W to each wafer cassette 1. Wafer carrying pin set 4 is configured to be rotatable in θ direction, and to be capable of carrying wafers W to an alignment unit (ALIM) and an extension unit (EXT) belonging to a third multistage-unit set G3 on processing station 20 side, which will be described later.

As shown in FIG. 1, at the center of processing station 20, a vertical carry type main wafer carrying mechanism 21 moved vertically by a moving mechanism 22 is provided. Around main wafer carrying mechanism 21, all the processing units are arranged so as to form one set or a plurality of sets (in the example shown in FIG. 1, five sets) of multistage units. In the example of FIG. 1, a first multistage-unit set G1 and a second multistage-unit set G2 are arranged in parallel on the system front side. The third multistage-unit set G3 is arranged adjacent to cassette station 10. A fourth multistage-unit set G4 is arranged adjacent to interface portion 30. A fifth multistage-unit set G5 is arranged on the rear side.

Here, as shown in FIG. 2, in first set G1, a resist coating unit (COT) that places wafer W in a cup (container) 23 on a spin chuck (not shown) and performs prescribed processing and a developing unit (DEV) that develops a resist pattern having wafer W and a developing solution supplying portion (not shown) opposed to each other are stacked in order from the bottom in the vertical direction, thereby forming two stages. Likewise, in second set G2, a resist coating unit (COT) and a developing unit (DEV) are stacked in order from the bottom in the vertical direction, thereby forming two stages. The resist coating units (COT) are arranged on the lower side since the discharging of the resist solution is troublesome mechanistically and in maintenance. However, it is also possible to arrange the resist coating units (COT) on the upper side.

As shown in FIG. 3, in third set G3, an oven type processing unit that places wafer W on wafer placing table 24 and performs a prescribed processing, e.g., a cooling unit (COL) that cools wafer W, an adhesion unit (AD) that performs hydrophobizing processing on wafer W, an alignment unit (ALIM) that performs alignment of wafer W, an extension unit (EXT) that carries wafer W in and away, and four hot plate units (BP) employing a heat treatment apparatus for baking wafer W are stacked in order from the bottom in the vertical direction, thereby forming eight stages, for example.

In fourth set G4, an oven type processing unit, e.g., a cooling unit (COL), an extension cooling unit (EXTCOL), an extension unit (EXT), a cooling unit (COL), two chilling hot plate units (CHP) employing the heat treatment apparatus according to the present invention having the quenching function, and two hot plate units (HP) employing the heat treatment apparatus according to the present invention, are stacked in order from the bottom in the vertical direction, thereby forming eight stages, for example.

By arranging on the lower side the cooling units (COL) and extension cooling unit (EXTCOL) of which processing temperature is low and arranging on the upper side hot plate units (HP), chilling hot plate units (CHP) and adhesion units (AD), thermal interference among the units can be reduced. On the other hand, such arrangement of the units can be changed.

As shown in FIG. 1, in processing station 20, in the sidewalls of third multistage-unit set G3 and fourth multistage-unit set G4 (the oven type processing units) adjacent to first multistage-unit set G1 and second multistage-unit set G2 (the spinner type processing unit), ducts 25 and 26 are provided, respectively, longitudinally crossing in the vertical direction. Through ducts 25 and 26, downflow clean air or the air having its temperature specially adjusted is passed. With the duct structure, the heat generated at the oven type processing units of third set G3 and fourth set G4 is shut off so as not to affect the spinner type processing units of the first set G1 and second set G2.

In the processing system, as shown by a dashed line in FIG. 1, a fifth multistage-unit set G5 can be arranged also on the rear side of main wafer carrying mechanism 21. Fifth multistage-unit set G5 is movable along a guide rail 27 sideways as seen from main wafer carrying mechanism 21. Accordingly, also in the case where fifth multistage-unit set G5 is provided, a space is ensured by sliding the unit. Accordingly, maintenance works can easily be performed from the rear side of main wafer carry mechanism 21.

Though interface portion 30 is equal in size to processing station 20 in the depth direction, interface portion 30 is smaller in the width direction. On the front side of interface portion 30, a portable pickup cassette 31 and a stationery buffer cassette 32 are arranged, thereby forming two stages.

On the rear side, an edge exposure apparatus 33 that is an exposure apparatus exposing the edge and identification mark area of wafer W is provided. At the center, a wafer carrying arm 34 that is a carrying portion is provided. Carrying arm 34 is configured to move in X and Z directions to carry wafer W to cassettes 31 and 32 and edge exposure apparatus 33. Carrying arm 34 is configured to be rotatable in θ direction, and capable of carrying wafer W also to the extension unit (EXT) belonging to fourth multistage-unit set G4 on processing station 20 side and to an adjacent wafer transfer table (not shown) on the exposure apparatus side.

The processing system configured as above is installed in a clean room 40. The cleanliness of each portion is further enhanced in the system by the efficient vertical laminar air-flow scheme.

Figure 4:
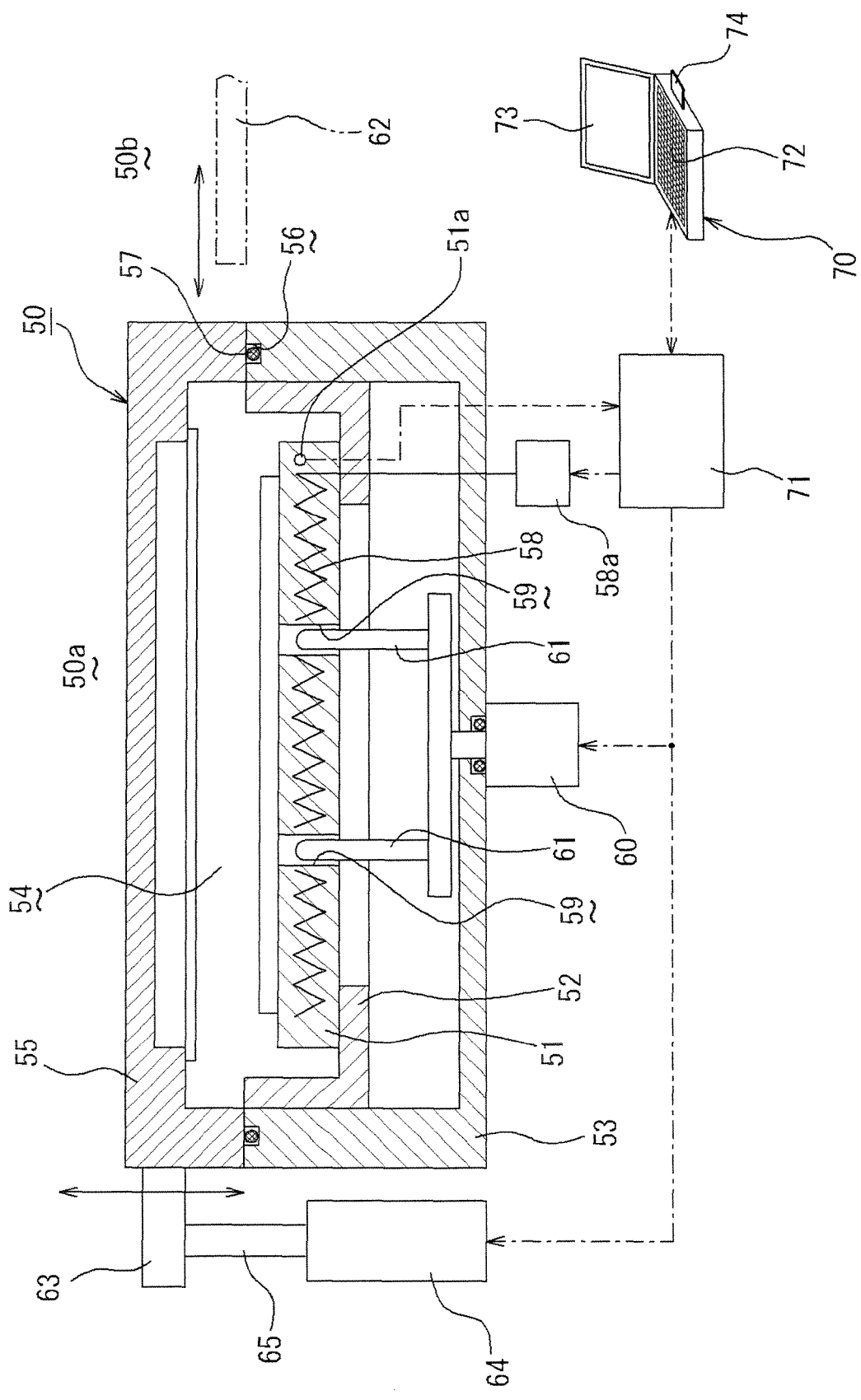
FIG. 4 is a schematic cross-sectional view showing a first embodiment of the heat treatment apparatus according to the present invention.

Next, referring to FIG. 4, the heat treatment apparatus according to the present invention implementing the hot plate unit (HP) and chilling hot plate unit (CHP) is detailed. Here, the case where the heat treatment apparatus according to the present invention is applied to the chilling hot plate unit (CHP) is described.

As shown in FIG. 4, heat treatment apparatus 50 is provided with, inside a casing (not shown) of the heat treatment unit, a heating portion 50a that heat wafers W, and a cooling portion 50b that cools wafers W. Heating portion 50a is provided with a heat plate 51 on which wafer W having a resist film, i.e., a coating film, formed on its surface is placed and heated, a support table 52 that surrounds the periphery and the bottom side of heat plate 51, a support ring 53 as a case that surrounds the periphery and the bottom side of support table 52, and a cover body 55 that covers the top opening of support ring 53 and that cooperates with support ring 53 to form a heat treatment chamber. A surface at the top portion of support ring 53 abutting on cover body 55 is provided with a circular groove 56, into which an O ring 57 is inserted.

Embedded in heating plate 51 is a temperature heater 58 that is set to a prescribed temperature controlled by a temperature controller 58a. Through holes 59 are provided at three locations concentrically. A support pin 61 ascending and descending by an ascending/descending drive mechanism 60 provided below heat plate 51 can penetrate through hole 59. Ascending and descending of support pin 61 causes wafers W to be transferred between heating plate 51 and cooling plate 62 of cooling portion 50b.

To heat plate 51, a temperature sensor 51a that is a temperature detecting portion detecting the temperature of heat plate 51 is attached. A detection signal indicative of the temperature of heat plate 51 detected by temperature sensor 51a is transmitted to a control portion 71, which is primarily constituted of a central processing unit (CPU) of control computer 70 that will be described later.

At one end of cover body 55, a supporting portion 63 is projectingly provided, to which a piston rod 65 of a cover body ascending/descending mechanism, e.g., an ascending/descending cylinder 64, is coupled. Accordingly, driving of ascending/descending cylinder 64 causes cover body 55 to move to contact with and separate from support ring 53, that is, to move to close and open.

Ascending/descending cylinder 64 and ascending/descending drive mechanism 60 are electrically connected to control portion 71 that will be described later, and configured such that driving, i.e., the opening and closing operation of cover body 55 and the ascending and descending operation of support pin 61 are performed based on a control signal from control portion 71.

As schematically shown in FIG. 1, control computer 70 includes control portion 71 primarily constituted of a central processing unit (CPU), an input/output portion 72 connected to control portion 71, a displaying portion 73 displaying a processing sequence input window for creating a processing sequence, and a recording medium 74 inserted into input/output portion 72 and storing control software. Specifically, control computer 70 is arranged at cassette placing table 2 of cassette station 10 as shown in FIG. 2. In this case, control computer 70 is constituted of an input/output portion formed by a drawer type keyboard, a displaying portion 73 formed by a display, and a recording medium 74. Recording medium 74 stores parameters of optimum information such as the timing, period and number of opening and closing operation of cover body 55, which will be described later.

Recording medium 74 may be the one that is fixedly provided in control computer 70, or it may be the one that is removably inserted into a reading apparatus provided in control computer 70 and that can be read by the reading apparatus. In the most typical embodiment, recording medium 74 is a hard disk drive in which control software is installed by an operator of the manufacturer of a substrate processing apparatus. In another embodiment, recording medium 74 is a read-only removable disk such as CD-ROM or DVD-ROM to which control software is written. Such a removable disk is read by an optical reading apparatus provided in control computer 70. Recording medium 74 may be in either format of RAM (Random Access Memory) or ROM (Read Only Memory). Recording medium 74 may be a cassette type ROM. That is, anything that is known in the technical field of computer can be used as recording medium 74.

Figure 5:
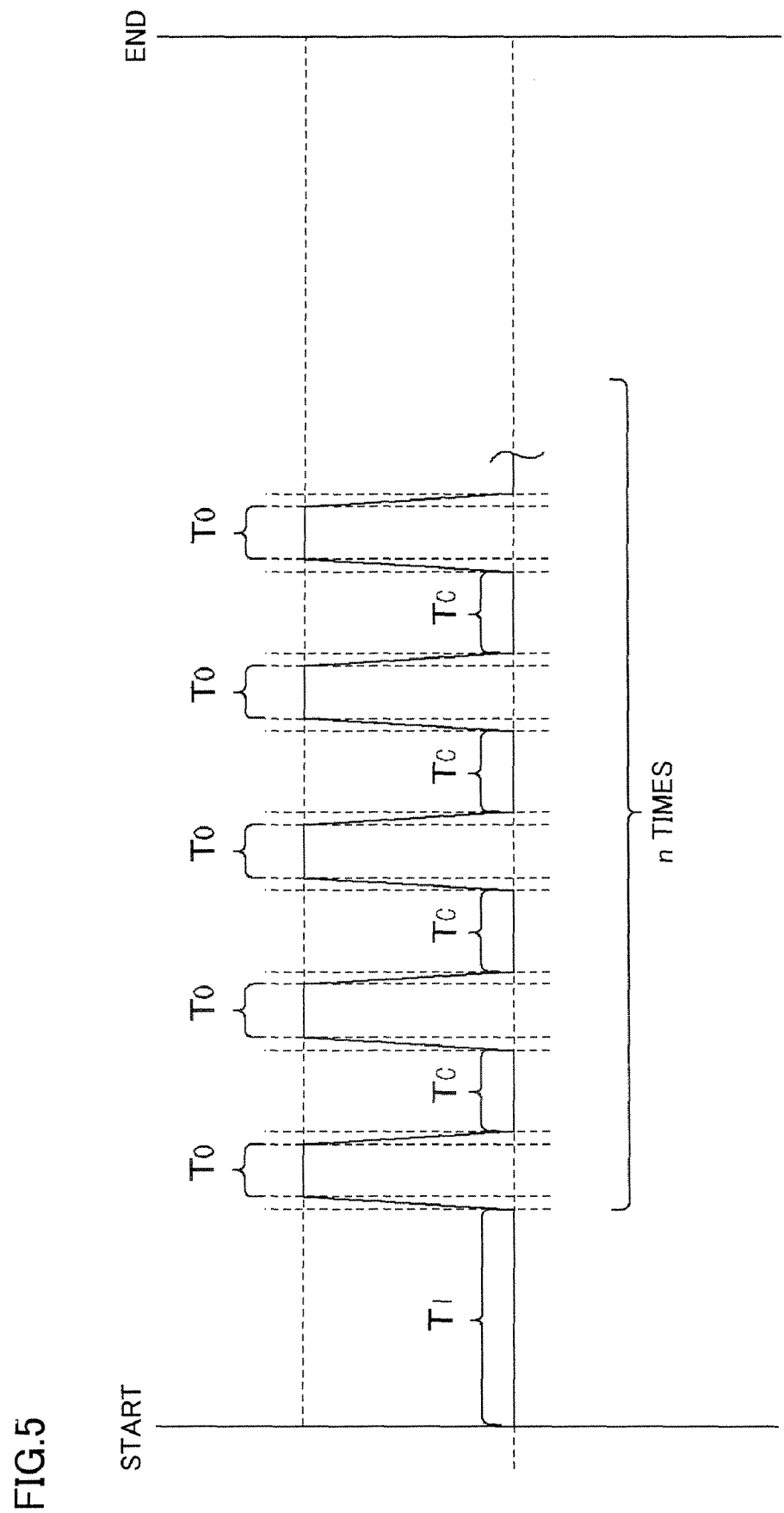
FIG. 5 is a time chart indicative of the opening and closing operation of a cover body and parameters.
Figure 6:
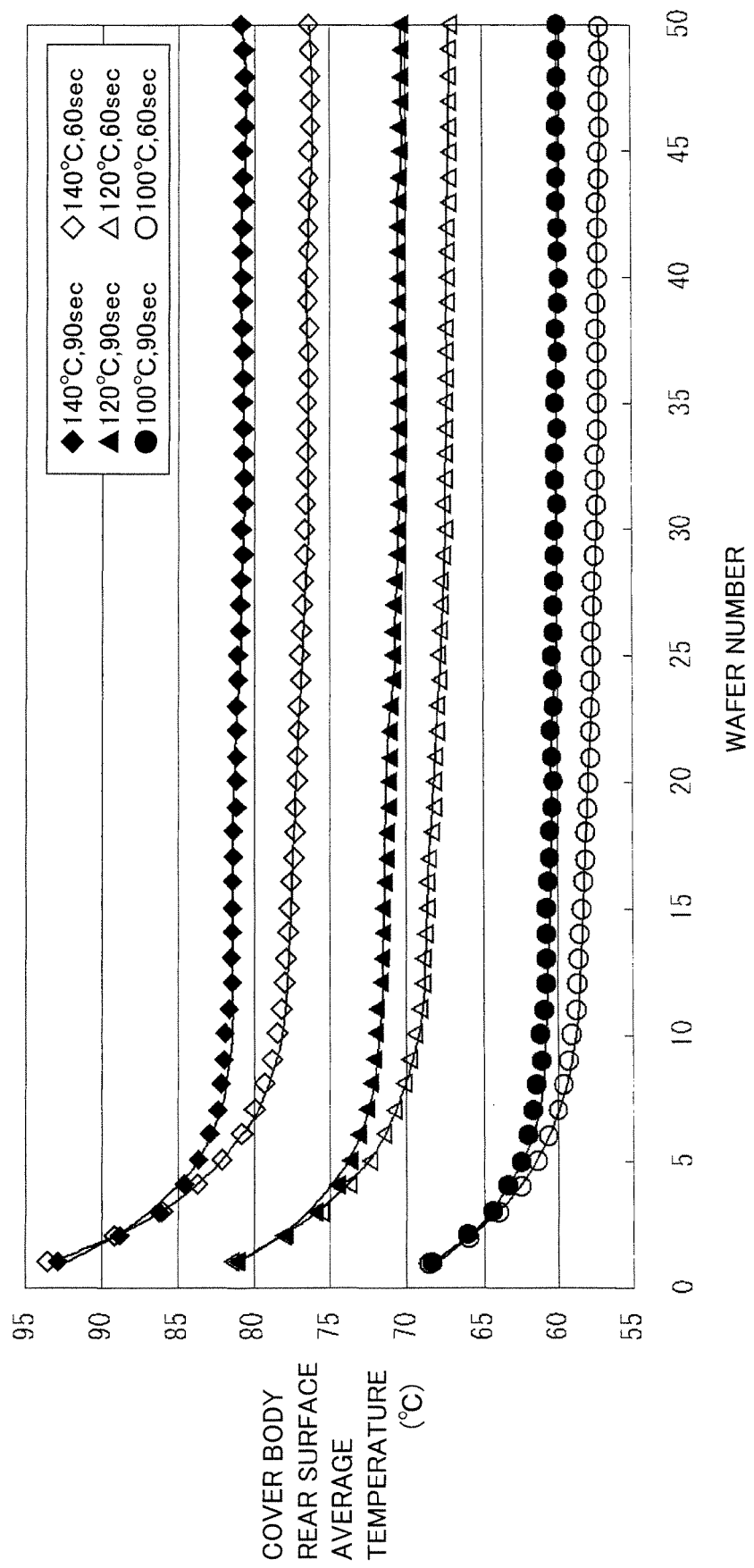
FIG. 6 is a graph showing a relationship of a cover rear surface temperature (a processing temperature) during wafer treatment relative to a temperature of a heat plate in the present invention.
Figure 7:
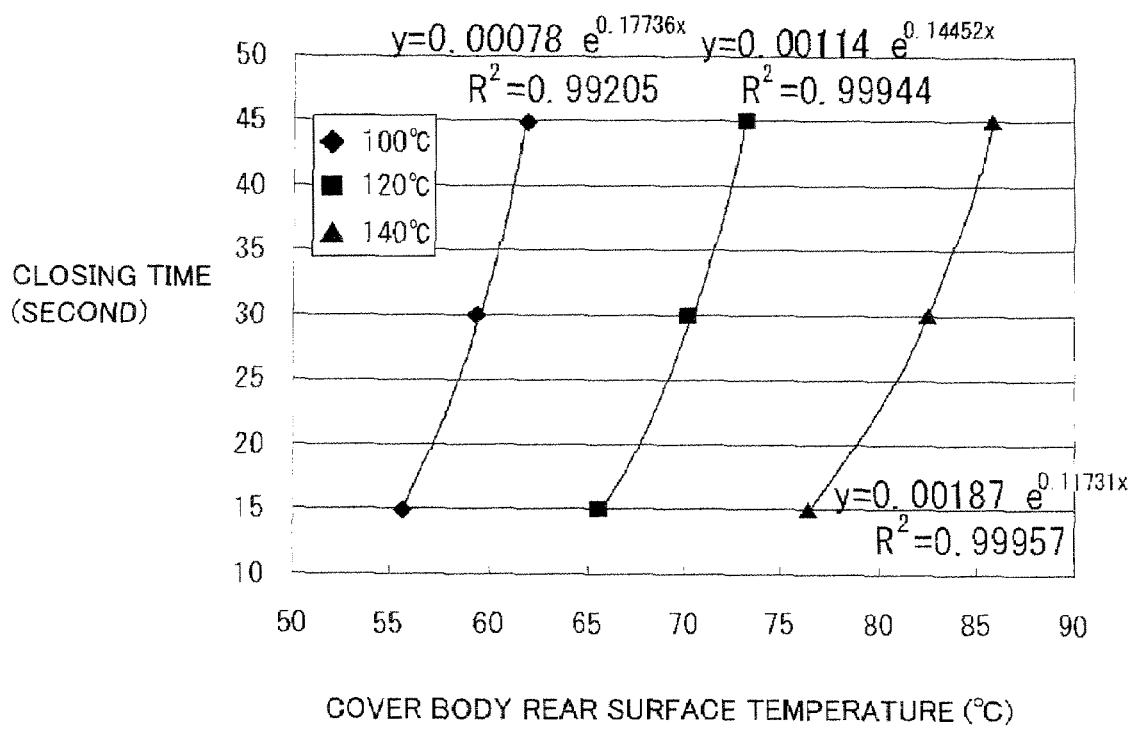
FIG. 7 is a graph showing a relationship between the cover rear surface temperature (the processing temperature) and a closing time of the cover body in the present invention.

Next, referring to FIGS. 5 to 7, the opening and closing operation of cover body 55 and parameters will be described. First, a processing temperature in heat treatment chamber 54 relative to a set temperature of heating plate 51, i.e., a saturation temperature, is obtained. Here, 50 pieces of wafers W were subjected to heat treatment, with the set temperature of heat plate 51 of 100° C., 120° C., and 140° C., and the processing time of 60 seconds and for 90 seconds for each temperature. Wafers W were measured, and the relationship between the average temperature of the rear surface of the cover body and each wafer W was as shown in the graph of FIG. 6 and Table 1.

| Heat plate temperature | 60 seconds treatment | 90 seconds treatment | Average |
|---|---|---|---|
| 100° C. | 56.8 | 59.5 | 58.2 |
| 120° C. | 67.0 | 70.2 | 68.6 |
| 140° C. | 76.3 | 80.7 | 78.5 |

From the above measurement result, the target temperature is determined to be the saturation temperature average. Specifically, the saturation temperature average 58.2° C. for the set temperature of the heat plate 100° C., the saturation temperature average 68.6° C. for the set temperature of the heat plate 120° C., and the saturation temperature average 78.5° C. for the set temperature of the heat plate 140° C.

Next, opening time To and closing time Tc of cover body 55 are measured. By the specification of the program, opening time To and closing time Tc are the repetition of the same value. For dissipating the heat of cover body 55 as quickly as possible and for minimizing the variation width of the temperature of cover body 55 thereafter, it is easier to set parameters with fixed opening time To. Therefore, description will be given as to the case where opening time To is fixed.

The opening and closing operation of cover body 55 was performed for three patterns of closing time Tc of 15 seconds, 30 seconds, and 45 second, for each set temperature 100° C., 120° C., and 140° C. of heat plate 51, to see the temperature of cover body 55 at the moment. This is shown in the graph of FIG. 7.

From thus obtained temperature variation per unit time (second) for each set temperature -100° C., 120° C., and 140° C. of heat plate 51, the time with which the target temperature (58.2° C., 68.6° C., and 78.5° C.) can be approximated are as shown in Table 2.

TABLE 2

| Heat plate temperature | Tc time |
| --- | --- |
| 100° C. | 24 seconds |
| 120° C. | 23 seconds |
| 140° C. | 20 seconds |

From the above result, closing time Tc is 24 seconds when the set temperature of heat plate 51 is 100° C., closing time Tc is 23 seconds when the set temperature of heat plate 51 is 120° C., and closing time Tc is 20 seconds when the set temperature of heat plate 51 is 140° C. Therefore, as the average, closing time Tc is determined to be 23 seconds.

Opening time To of cover body 55 is set to 15 seconds, based on the empirical value obtained by repetition tests. The conditions are: standby time TI for start of the opening and closing operation of cover body 55 is 1 second; the number of repetition is set to infinite; and the repetition is stopped when wafer W is carried into heat treatment chamber 54.

The opening and closing operation of cover body 55 and parameters (see FIG. 5) obtained as above are stored in storage medium 74. Execution of control software by control computer 70 configured as described above causes cover body 55 to perform the opening and closing operation based on the above parameters during a period, for example, after the last wafer W in the preceding lot is carried away from heat treatment chamber 54 of heat treatment apparatus 50 until the first wafer W in the subsequent lot is carried into heat treatment chamber 54, whereby the accumulated heat temperature of heat treatment chamber 54 can be maintained at the processing temperature (the saturation temperature). Thus, wafers W carried into heat treatment chamber 54 is placed under the processing temperature on arrival, and subjected to the heat treatment.

For example, in changing the set temperature of heat plate 51 from 120° C. to 100° C., the processing temperature is changed, and thereafter cover body 55 is ascended to stands by in the open state to dissipate heat. Here, no control is provided from temperature controller 58a. When the temperature of heat plate 51 lower than the set value, e.g., 98° C. due to the heat dissipation is detected by temperature sensor 51a, a detection signal is transmitted to control portion 71. Based on a control signal from control portion 71, ascending/descending cylinder 64 drives, descending cover body 55 to close. In this state, control from temperature controller 58a is provided, thereby controlling the temperature of heat plate 51 to be 100° c. Thus, the heat atmosphere of heat treatment chamber 54 can be stabilized.

Further, for example, in changing the set temperature of heat plate 51 from 120° C. to 140° C., control from temperature controller 58a is provided with cover body 55 closed, thereby controlling the temperature of heat plate 51 to be 140° C. Thus, heat can quickly be accumulated in cover body 55 and the heat atmosphere of heat treatment chamber 54 can quickly be stabilized.

By changing the set temperature of heat plate 51 in the above-described manner, even when there is a difference between the set value to which the temperature setting is switched and the current set value in continuously processing different lots, the temperature of heat treatment chamber 54 can quickly approximate the processing temperature by controlling the opening and closing operation of cover body 55 depending on the temperature of heat plate 51.

When the processing temperature of wafers W subjected to the processing is to be changed, parameters based on that processing recipe may be stored in control computer 70 in advance. Then, in order to more quickly stabilize the temperature of heat treatment chamber 54 based on the parameters, standby time TI until the start of the opening and closing operation of cover body 55 can be calculated in accordance with a temperature change width and thereby adjusted. It is noted that, when the temperature of heat plate 51 is changed for example by 10° C. or more, it may be set such that an alarm indicative of "standby until the temperature of cover body 55 is stabilized" is issued so that the opening and closing operation of cover body 55 is not started until an automatically calculated standby time elapses. This can eliminate a superfluous opening and closing operation of cover body 55, thereby increasing the lifetime of ascending/descending cylinder 64. Further, by minimizing the opening and closing operation of cover body 55, foreign objects can be prevented from entering heat treatment chamber 54.

Next, an operation manner of the resist coating/developing processing system configured as above will be described.

First, in cassette station 10, cover opening/closing apparatus 5 actuates, opening the cover of wafer cassette 1 of the preceding lot. Next, wafer carrying pin set 4 accesses cassette 1 that stores unprocessed wafers W on cassette placing table 2, and takes out one wafer W from cassette 1. After taking out wafer W from cassette 1, wafer carrying pin set 4 moves to an alignment unit (ALIM) arranged in third multistage-unit set G3 on processing station 20 side, and places wafer W on wafer placing table 24 in the alignment unit (ALIM). On wafer placing table 24, wafer W is subjected to orientation flat alignment and centering. Thereafter, main wafer carrying mechanism 21 accesses the alignment unit (ALIM) from the opposite side to receive wafer W from wafer placing table 24.

In processing station 20, main wafer carrying mechanism 21 carries wafer W into firstly an adhesion unit (AD) belonging to third multistage-unit set G3. In the adhesion unit (AD), wafer W is subjected to hydrophobizing processing. When the hydrophobizing processing is finished, main wafer carrying mechanism 21 carries wafer W away from the adhesion unit (AD), and next it carries wafer W into a cooling unit (COL) belonging to third multistage-unit set G3 or fourth multistage-unit set G4. In this cooling unit (COL), wafer W is cooled to the set temperature before resist coating processing, e.g., 23° C. When the cooling processing is finished, main wafer carrying mechanism 21 carries wafer W away from the cooling unit (COL), and subsequently, it carries wafer W into a resist coating unit (COT) belonging to first multistage-unit set G1 or second multistage-unit set G2. In the resist coating unit (COT), wafer W has its surface coated with resist in an even thickness through the spin coat method.

When the resist coating processing is finished, main wafer carrying mechanism 21 carries wafer W away from the resist coating unit (COT), and subsequently, it carries wafer W into a hot plate unit (HP). In the hot plate unit (HP), wafer W is placed on a placing table, and subjected to pre-bake processing for a prescribed time at a prescribed temperature, e.g., 100° C. Thus, residual solvent is vaporized and removed from the coating film on wafer W. When the pre-bake is finished, main wafer carrying mechanism 21 carries wafer W away from the hot plate unit (HP), and subsequently, it carries wafer W into an extension cooling unit (EXTCOL) belonging to fourth multistage-unit set G4. In the extension cooling unit (EXTCOL), wafer is cooled to a temperature suitable to the next processing, i.e., edge exposure processing in edge exposure apparatus 33, for example to 24° C. After the cooling, main wafer carrying mechanism 21 carries wafer W to an extension unit (EXT) immediately above, and places wafer W on a placing table (not shown) in this extension unit (EXT). When wafer W is placed on the placing table in the extension unit (EXT), carrying arm 34 of interface portion 30 accesses from the opposite side and receives wafer W. Carrying arm 34 carries wafer W into edge exposure apparatus 33 in interface portion 30. In edge exposure apparatus 33, a redundant resist film (portion) at the edge of the wafer W surface is irradiated with light to expose the edge.

After the edge exposure is finished, carrying arm 34 carries wafer W away from inside the housing of edge exposure apparatus 33, and carries wafer W to a wafer receiving table (not shown) on the adjacent exposure apparatus side.

When wafer W has it entire surface exposed in the exposure apparatus and returned to the wafer receiving table on the exposure apparatus side, carrying arm 34 of interface portion 30 accesses that wafer receiving table and receives wafer W. Carrying arm 34 carries the received wafer W into the extension unit (EXT) belonging to fourth multistage-unit set G4 on processing station 20 side and places wafer W on the wafer receiving table.

Wafer W placed on the wafer receiving table is carried to (into) heat treatment apparatus 50 of the chilling plate unit (CHP) by main wafer carrying mechanism 21, where post-exposure-bake processing is performed for a prescribed time at 120° C., for example, in order to prevent generation of fringe or to induce an acid catalytic reaction in chemically-amplified resist (CAR). Here, in heat treatment apparatus 50, as described above, the accumulated heat temperature of heat treatment chamber 54 is maintained at the processing temperature (the saturation temperature) by the opening and closing operation of cover body 55 based on the parameters of the processing recipe until wafer W is carried into heat treatment chamber 54. Accordingly, wafer W carried into heat treatment chamber 54 is placed under the processing temperature on arrival and subjected to the heat treatment.

Cover body 55 performs the opening and closing operation during a period after the last wafer W in the preceding lot is carried away from heat treatment chamber 54 of heat treatment apparatus 50 until the first wafer W in the subsequent lot is carried into heat treatment chamber 54, whereby accumulated heat temperature of heat treatment chamber 54 is maintained at the processing temperature (the saturation temperature).

Thereafter, wafer W is carried into a developing unit (DEV) belonging to first multistage-unit set G1 or second multistage-unit set G2. In the developing unit (DEV), the resist on the surface of wafer W is fully supplied with the developing solution to achieve developing processing. By this developing processing, the resist film formed on the surface of wafer W is developed to form a prescribed circuit pattern, and the redundant resist film at the edge of wafer W is removed. Further, the resist film adhered to the alignment mark region formed (provided) on the surface of wafer W is removed. When the development is finished in this manner, the rinse liquid is supplied to the surface of wafer W to wash away the developing solution.

When the developing processing is finished, main wafer carrying mechanism 21 carries wafer W away from the developing unit (DEV), and subsequently, carries wafer W into a hot plate unit (HP) belonging to third multistage-unit set G3 or fourth multistage-unit set G4. In the hot plate unit (BP), wafer W is subjected to post-bake processing for a prescribed time at 100° C., for example. This cures the resist having swollen by the development, improving the chemical resistance.

When the post-bake is finished, main wafer carrying mechanism 21 carries wafer W away from the hot plate unit (HP), and subsequently, carries wafer W into any cooling unit (COL). After wafer W returns to the room temperature, main wafer carrying mechanism 21 carries wafer W to an extension unit (EXT) belonging to third set G3. When wafer W is placed on the placing table (not shown) of this extension unit (EXT), wafer carrying pin set 4 on cassette station 10 side accesses from the opposite side and receives wafer W. Wafer carrying pin set 4 puts the received wafer W in a prescribed wafer storage groove of wafer cassette 1 for storing processed wafers on the cassette placing table. After all the processed wafers W are stored, cover opening/closing apparatus 5 actuates to close the cover, thereby completing the processing.

Other Embodiments

Figure 10:
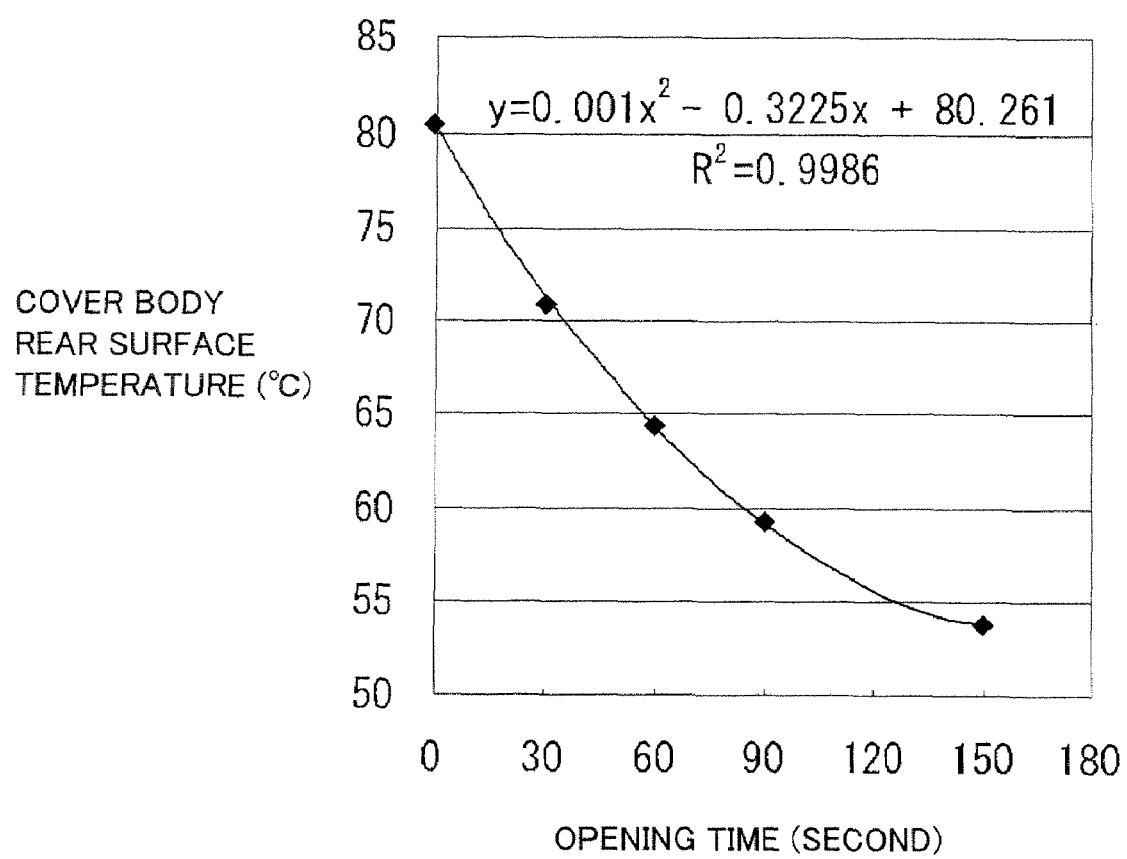
FIG. 10 is a graph showing a relationship between the cover rear surface temperature (the processing temperature) and an opening time of the cover.

While in the above-described embodiment opening time To of cover body 55 is a fixed value and closing time Tc is a parameter, opening time To can be a parameter. When opening time To is to be a parameter, it may be set as follows, for example. The temperature at the rear surface of cover body 55 was examined, with the set temperature of heat plate 51 of 120° C., for each processing time of 30 seconds, 60 seconds, 90 seconds, and 150 seconds. The result as shown in FIG. 10 was obtained. The temperature of cover body 55 is reduced by 10° C. in 30 seconds, that is, 0.3° C./second. Opening time To can be set such that this temperature per unit time (0.3° C./second) approximates the processing temperature (the saturation temperature).

Figure 11:
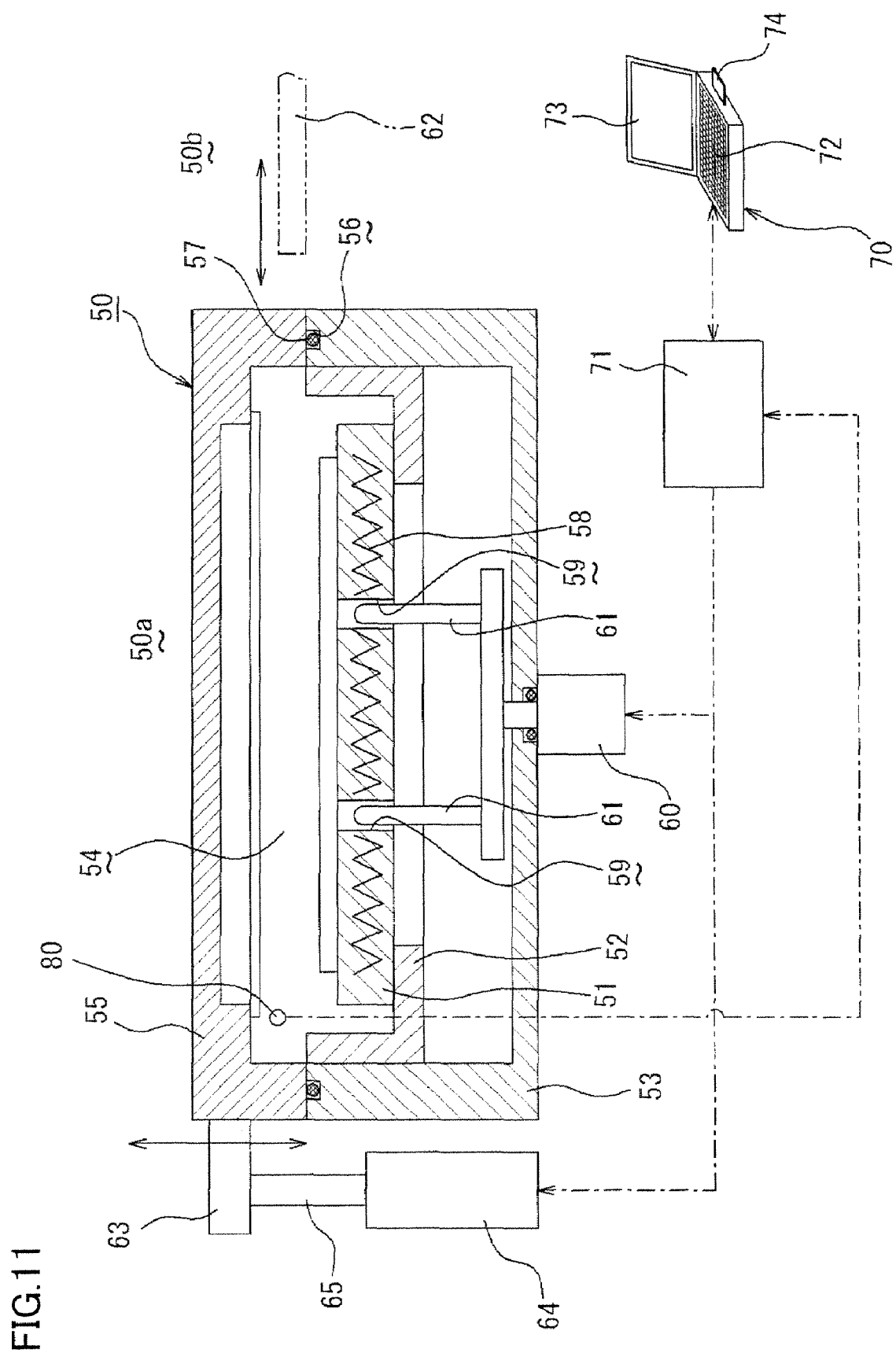
FIG. 11 is a schematic cross-sectional view showing another embodiment of the heat treatment apparatus according to the present invention.

Further, as a still another embodiment of the present invention, the temperature of heat treatment chamber 54 may be detected by the temperature detecting portion, and the opening and closing operation of cover body 55 may be performed based on the detected temperature. For example, as shown in FIG. 11, temperature sensor 80 that is a temperature detecting portion provided in heat treatment chamber 54, specifically on the rear surface side of cover body 55, and control portion 71 of control computer 70 are electrically connected. Then, by temperature sensor 80, the temperature of heat treatment chamber 54 (the rear surface side of cover body 55) is detected. The detection signal is transmitted to control portion 71 of control computer 70 so that control computer 70 recognizes the current temperature state of heat treatment chamber 54. Based on a control signal from control portion 71, ascending/descending cylinder 64 is driven to open and close cover body 55 to thereby maintain the accumulated heat temperature at the processing temperature (the saturation temperature).

The rest of the configuration shown in FIG. 11 is the same as the first embodiment shown in FIG. 4, and therefore identical reference characters are allotted to the identical parts, and description thereof is not repeated.

While in the above embodiment the description has been given on the case where the heat treatment apparatus according to the present invention is applied to a substrate heat treatment apparatus that performs post-exposure-bake processing, it is similarly applicable to a heat treatment apparatus that performs processing other than the post-exposure-bake processing, e.g., a heat treatment apparatus that performs post-bake processing, and the similar effect can be obtained.

While in the above embodiment the description has been given on the case where the substrate heat treatment apparatus according to the present invention is applied to a heat treatment apparatus in a resist coating/developing processing system for semiconductor wafers, as a matter of course the present invention is also applicable to a heat treatment apparatus in a resist coating/developing processing system for LCD glass substrates.

Figure 8:
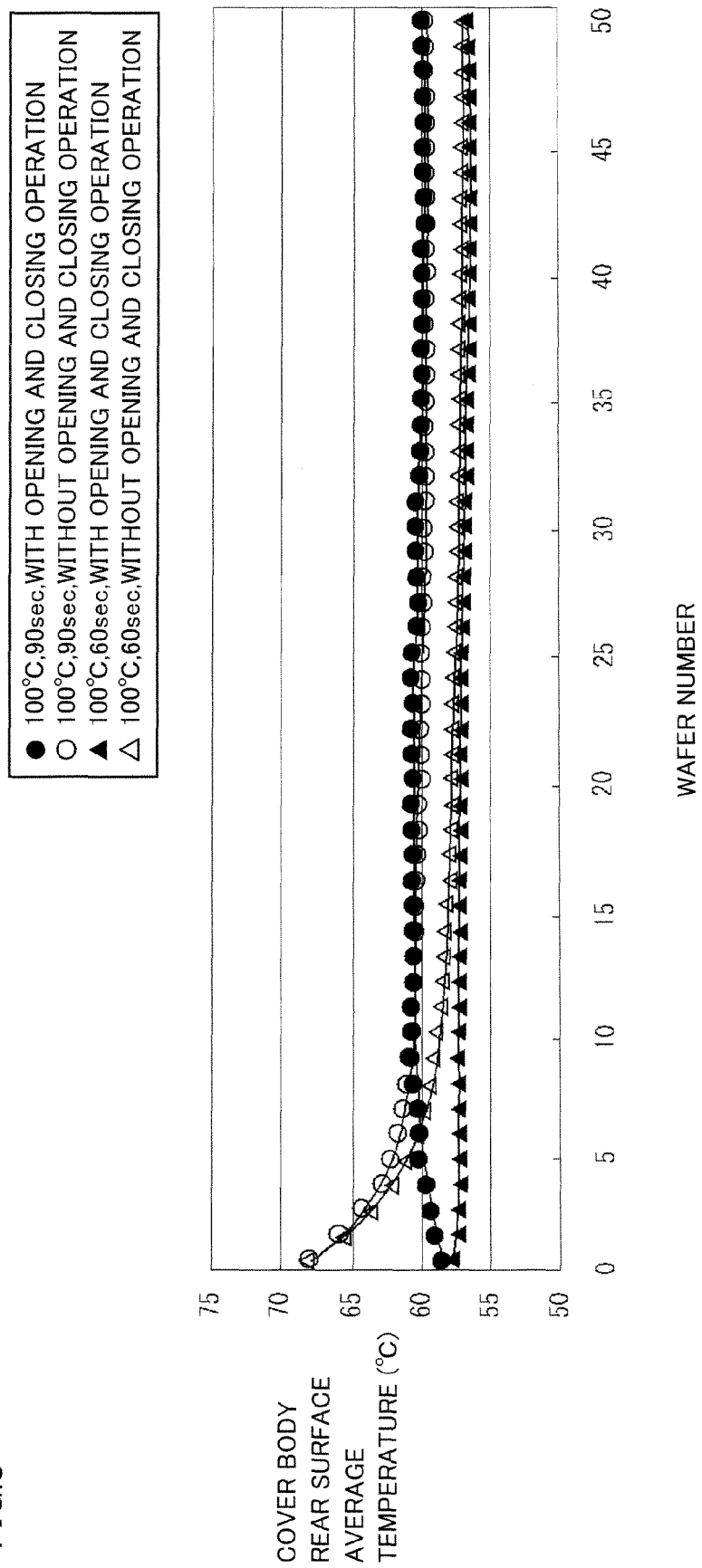
FIG. 8 is a graph showing in comparison the cover rear surface temperature (the processing temperature) with an opening and closing operation of the cover body and that without the opening and closing operation of the cover body.

EXAMPLE (1) 50 pieces of wafers W were subjected to heat treatment with the set temperature of heat plate 51 being 100° C., for each treatment time of 60 seconds and 90 seconds, each with and without the opening and closing operation of cover body 55 according to the present invention. Wafers W were measured and the result as to the relationship between the cover rear surface average temperature and each wafer W as shown in the graph of FIG. 8 was obtained.

As a result, with the processing time of 60 seconds, the cover rear surface temperature range without the opening and closing operation was 11.6° C., whereas the cover rear surface temperature range with the opening and closing operation according to the present invention was 1.8° C., achieving an improvement of about 85%. With the processing time of 90 seconds, the cover rear surface temperature range without the opening and closing operation was 8.9° C., whereas the cover rear surface temperature range with the opening and closing operation according to the present invention was 1.9° C., achieving an improvement of about 79%.

Figure 9:
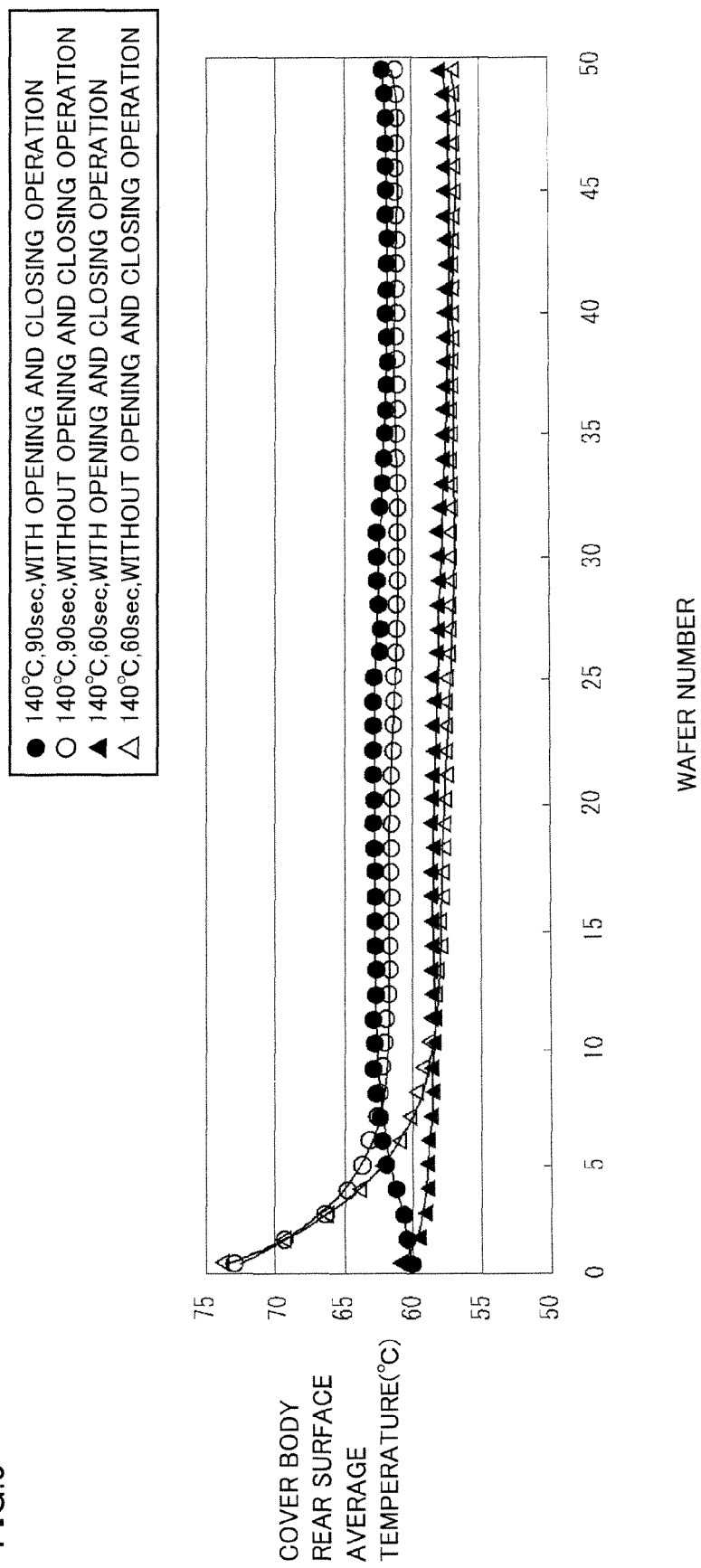
FIG. 9 is another graph showing in comparison the cover rear surface temperature (the processing temperature) with an opening and closing operation of the cover body and that without the opening and closing operation of the cover body.

(2) 50 pieces of wafers W were subjected to heat treatment with the set temperature of heat plate 51 being 140° C., for each treatment time of 60 seconds and 90 seconds, each with and without the opening and closing operation of cover body 55 according to the present invention. Wafers W were measured and the result as to the relationship between the cover rear surface average temperature and each wafer W as shown in the graph of FIG. 9 was obtained.

As a result, with the processing time of 60 seconds, the cover rear surface temperature range without the opening and closing operation was 17.4° C., whereas the cover rear surface temperature range with the opening and closing operation according to the present invention was 41° C., achieving an improvement of about 76%. With the processing time of 90 seconds, the cover rear surface temperature range without the opening and closing operation was 12.3° C., whereas the cover rear surface temperature range with the opening and closing operation according to the present invention was 2.7° C., achieving an improvement of about 78%.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heat treatment method of performing heat treatment on a workpiece substrate using a heat treatment apparatus that has a heat plate provided in a heat treatment chamber and that is capable of opening and closing said heat treatment chamber by an opening and closing operation of a cover body, comprising the steps of:
   maintaining a temperature in said heat treatment chamber at a prescribed temperature by performing said opening and closing operation of said cover body;
   carrying the workpiece substrate into said heat treatment chamber; and
   performing heat treatment with said heat plate on said workpiece substrate carried into said heat treatment chamber,
   wherein at least one of an opening time and a closing time of said cover body in said opening and closing operation of said cover body is set based on a curve indicative of a relationship between a ratio between said opening time and said closing time of said cover body and a temperature in said heat treatment chamber, and on a processing temperature of said heat treatment.

2. The heat treatment method according to claim 1, wherein said opening and closing operation of said cover body includes opening and closing said cover body for a plurality of times.

3. The heat treatment method according to claim 2, wherein said prescribed temperature is set based on a processing temperature of said heat treatment.

4. The heat treatment method according to claim 1, wherein said prescribed temperature is set based on the processing temperature of said heat treatment.

5. The heat treatment method according to claim 1, further comprising a step of sensing a temperature of said heat plate,
   wherein said opening and closing operation of said cover body is controlled based on the sensed temperature of said heat plate.

6. The heat treatment method according to claim 1, further comprising a step of sensing a temperature of said heat treatment chamber,
   wherein said opening and closing operation of said cover body is controlled based on the sensed temperature of said heat treatment chamber.

7. The heat treatment method according to claim 1, wherein the heat treatment is performed on a plurality of said workpiece substrates, and
   when a processing temperature of the plurality of said workpiece substrates is changed, a standby time until the opening and closing operation of said cover body is started is set based on an amount of change in the temperature.

8. A recording medium recording a program operating on a computer, the recorded program being configured to cause the computer to control said opening and closing operation of the cover body so that the heat treatment method according to claim 1 is performed.

9. A heat treatment method of performing heat treatment on a workpiece substrate using a heat treatment apparatus that has a heat plate provided in a heat treatment chamber and that is capable of opening and closing said heat treatment chamber by an opening and closing operation of a cover body, comprising the steps of:
   maintaining a temperature in said heat treatment chamber at a prescribed temperature by performing said opening and closing operation of said cover body;
   carrying the workpiece substrate into said heat treatment chamber; and
   performing heat treatment with said heat plate on said workpiece substrate carried into said heat treatment chamber,
   wherein at least one of an opening time and a closing time of said cover body in said opening and closing operation of said cover body is set based on a curve indicative of a relationship between a ratio between said opening time and said closing time of said cover body and a temperature in said heat treatment chamber, on a processing temperature of said heat treatment, and on a state of a carrying portion carrying said workpiece substrate to said heat treatment chamber.

10. The heat treatment method according to claim 9, wherein said opening and closing operation of said cover body includes opening and closing said cover body for a plurality of times.

11. The heat treatment method according to claim 10, wherein said prescribed temperature is set based on a processing temperature of said heat treatment.

12. The heat treatment method according to claim 9, wherein said prescribed temperature is set based on the processing temperature of said heat treatment.

13. The heat treatment method according to claim 9, further comprising a step of
sensing a temperature of said heat plate,
wherein said opening and closing operation of said cover body is controlled based on the sensed temperature of said heat plate.

14. The heat treatment method according to claim 9, further comprising a step of
sensing a temperature of said heat treatment chamber,
wherein said opening and closing operation of said cover body is controlled based on the sensed temperature of said heat treatment chamber.

15. The heat treatment method according to claim 9, wherein
the heat treatment is performed on a plurality of said workpiece substrates, and
when a processing temperature of the plurality of said workpiece substrates is changed, a standby time until the opening and closing operation of said cover body is started is set based on an amount of change in the temperature.

16. A recording medium recording a program operating on a computer, the recorded program being configured to cause the computer to control said opening and closing operation of the cover body so that the heat treatment method according to claim 9 is performed.

17. A heat treatment apparatus performing heat treatment on a workpiece substrate, comprising:
a heat plate heating said workpiece substrate;
a case that has an upper opening and that surrounds a circumference and a lower portion of said heat plate;
a cover body that covers said upper opening and constituting, with said case, a heat treatment chamber storing said heat plate and said workpiece substrate;
an opening/closing driving portion that opens and closes said cover body relative to said case; and
a control portion that controls the opening and closing operation of said cover body by said opening/closing driving portion, said control portion controlling said opening/closing driving portion such that a temperature in said heat treatment chamber is maintained at a prescribed temperature by the opening and closing operation of said cover body,
wherein said control portion sets at least one of an opening time and a closing time of said cover body in said opening and closing operation of said cover body based on a curve indicative of a relationship between a ratio between said opening time and said closing time of said cover body and a temperature in said heat treatment chamber, and on a processing temperature of said heat treatment.

18. The heat treatment apparatus according to claim 17, wherein the control portion controls said opening/closing driving portion to open/close said cover body for a plurality of times.

19. The heat treatment apparatus according to claim 17, wherein said control portion sets said prescribed temperature based on a processing temperature of said heat treatment.

20. The heat treatment apparatus according to claim 17, further comprising a temperature sensing portion sensing a temperature of said heat plate, wherein said control portion controls said opening/closing driving portion based on the temperature of said heat plate sensed by said temperature sensing portion.

21. A heat treatment apparatus performing heat treatment on a workpiece substrate, comprising:
a heat plate heating said workpiece substrate;
a case that has an upper opening and that surrounds a circumference and a lower portion of said heat plate;
a cover body that covers said upper opening and constituting, with said case, a heat treatment chamber storing said heat plate and said workpiece substrate;
an opening/closing driving portion that opens and closes said cover body relative to said case; and
a control portion that controls the opening and closing operation of said cover body by said opening/closing driving portion, said control portion controlling said opening/closing driving portion such that a temperature in said heat treatment chamber is maintained at a prescribed temperature by the opening and closing operation of said cover body,
wherein said control unit sets at least one of an opening time and a closing time of said cover body in said opening and closing operation of said cover body based on a curve indicative of a relationship between a ratio between said opening time and said closing time of said cover body and a temperature inside said heat treatment chamber, on a processing temperature of said heat treatment, and on a state of a carrying portion carrying said workpiece substrate to said heat treatment chamber.

22. The heat treatment apparatus according to claim 21, wherein the control portion controls said opening/closing driving portion to open/close said cover body for a plurality of times.

23. The heat treatment apparatus according to claim 21, wherein said control portion sets said prescribed temperature based on a processing temperature of said heat treatment.

24. The heat treatment apparatus according to claim 21, further comprising a temperature sensing portion sensing a temperature of said heat plate, wherein said control portion controls said opening/closing driving portion based on the temperature of said heat plate sensed by said temperature sensing portion.

* * * * *